United States Patent [19]

Russell

[11] Patent Number: 5,448,576

[45] Date of Patent: Sep. 5, 1995

[54] BOUNDARY SCAN ARCHITECTURE EXTENSION

[75] Inventor: Robert J. Russell, South Boston, Mass.

[73] Assignee: Bull HN Information Systems Inc., Billerica, Mass.

[21] Appl. No.: 968,104

[22] Filed: Oct. 29, 1992

[51] Int. Cl.$^6$ .................................. H04B 17/00
[52] U.S. Cl. .................. 371/22.3; 371/15.1; 371/25.1
[58] Field of Search ............... 371/22.1, 22.2, 22.3, 371/21.2, 21.6, 15.1, 25.1, 20.4, 20.5; 324/158 R; 307/272.2

[56] References Cited

U.S. PATENT DOCUMENTS

| | | | |
|---|---|---|---|
| 4,710,927 | 12/1987 | Miller | 371/15 |
| 5,029,166 | 7/1991 | Jarwala et al. | 371/22.1 |
| 5,048,021 | 9/1991 | Jarwala et al. | 371/22.3 |
| 5,099,481 | 3/1992 | Miller | 371/22.1 |
| 5,109,190 | 4/1992 | Sakashita et al. | 371/25.1 |
| 5,150,044 | 9/1992 | Hashizume et al. | 324/158 R |
| 5,155,732 | 10/1992 | Jarwala et al. | 371/22.3 |
| 5,228,045 | 7/1993 | Chiles | 371/15.1 X |
| 5,254,942 | 10/1993 | D'Souza et al. | 371/22.3 X |
| 5,260,947 | 11/1993 | Posse | 371/22.3 |
| 5,270,642 | 12/1993 | Parker | 324/158 R |
| 5,281,864 | 1/1994 | Hahn et al. | 307/272.2 |
| 5,285,152 | 2/1994 | Hunter | 324/158 R |
| 5,311,520 | 5/1994 | Raghavachari | 371/21.6 |

Primary Examiner—Emanuel T. Voeltz
Assistant Examiner—Kyle J. Choi
Attorney, Agent, or Firm—Faith F. Driscoll; John S. Solakian

[57] ABSTRACT

A method and apparatus provides improved modes of operation of a standard test bus based on a standard boundary scan architecture which minimizes the number of bits required to be serially scanned into the controllers of the various devices connected to the bus by temporarily disabling scan paths not required to be utilized. Means for continuously verifying the inoperative state of test logic and for diagnosing test logic faults are also described.

20 Claims, 7 Drawing Sheets

Fig. 6

PREFERRED EMBODIMENT

| BITS SCANNED | IC1 | IC40 | IC100 | SCAN |
|---|---|---|---|---|
| 1,100 | 11(BS) | 11(BS) | 11(BS) | 1(IR) |
| 4,300 | 43 | 43 | 43 | 2(DR) |
| 1,100 | 11(D) | 11(BS) | 11(D) | 3(IR) |
| 43 | | 43 | | 4(DR) |
| 11 | | 11(SI) | | 5(IR) |
| 130 | | 130 | | 6(DR) |
| 10,989 (11x999) | | 11(CLK) | | 999 LOOP 7(IR) |
| 10,989 (11x999) | | 11(BS) | | 8(IR) |
| 42,957 (43x999) | | 43 | | 9(DR) |
| 10,989 (11x999) | | 11(SI) | | 10(IR) |
| 129,870 (130x999) | | 130 | | 11(DR) |
| 11 | | 11(CLK) | | 12(IR) |
| 11 | | 11(BS) | | 13(IR) |
| 43 | | 43 | | 14(DR) |
| 11 | | 11(SI) | | 15(IR) |
| 130 | | 130 | | 16(DR) |
| 212,684 | | | | TOTAL BITS |

PRIOR ART

| SCAN | IC1 | IC40 | IC100 | BITS SCANNED |
|---|---|---|---|---|
| | 11(BS) | 11(BS) | 11(BS) | 1,100 |
| | 43 | 43 | 43 | 4,300 |
| | 11(BY) | 11(BS) | 11(BY) | 1,100 |
| | 1 | 43 | | 82 |
| | 11(BY) | 11(SI) | 11(BY) | 1,100 |
| | 1 | 130 | | 169 |
| | 11(BY) | 11(CLK) | 11(BY) | 1,098,900 (1,100x999) |
| | 11(BY) | 11(BS) | 11(BY) | 1,098,900 (1,100x999) |
| | 1 | 43 | 1 | 102,897 (103x999) |
| | 11(BY) | 11(SI) | 11(BY) | 1,098,900 (1,100x999) |
| | 1 | 130 | 1 | 189,810 (190x999) |
| | 11(BY) | 11(CLK) | 11(BY) | 1,100 |
| | 11(BY) | 11(BS) | 11(BY) | 1,100 |
| | | 43 | 1 | 103 |
| | 11(BY) | 11(SI) | 11(BY) | 1,100 |
| | | 130 | 1 | 190 |
| | | | | 3,600,851 |

BOUNDARY SCAN ARCHITECTURE EXTENSION

BACKGROUND OF THE INVENTION

1. Field of Use

The present invention relates to electronic integrated circuits (ICs) and, more particularly, to circuits which employ a standard boundary scan test access port.

2. Prior Art

A standard boundary scan test architecture was approved by the American National Standards Institute and the Institute of Electrical and Electronics Engineers in 1990. This architecture provides a means by which ICs may be designed in a standard fashion such that they or their external connections, or both, may be tested using a four or five wire interface.

The device test logic which connects to this interface is known as a test access port, or TAP. Device outputs normally controlled by the functional system logic of an IC chip may be controlled via the TAP. Also, device inputs to the functional system logic may be monitored via the TAP. All TAP control and data bits are passed in serial fashion on two lines: a test data input (TDI), and the test data output (TDO). Integral to each TAP is a TAP controller having a state machine which determines the function of the device test logic. A test clock (TCK) line and a test mode select (TMS) line determine the currently active state of each state machine. The state machine has been designed such that a logic one present at the TMS input for five consecutive clocks of TCK always results in placing the state machine in a state called test logic reset. In this state, the device test logic has no effect on the IC device functional logic circuits and the device operates essentially as if the test logic were not present. An optional test reset state (TRST*) line may be included in devices where there is a need to enter the test logic reset state without waiting for five TCK clock cycles. For example, such need may arise when there are possible output driver conflicts with other devices immediately after power up.

For compliance, the standard mandates the use of several specific operating modes for all devices while others are optional. For example, one mandated mode is known as EXTEST. This mode allows interconnections between devices to be checked by setting various outputs to known states and checking the receipt of these known states at various inputs to verify continuity. Additionally, through the use of potentially conflicting output states, the receipt of proper input states can verify the absence of shorts.

Optional modes include modes which, if present, must conform to the standard, and modes which are not defined by the standard. An example of the former is known as INTEST. This mode allows device functional logic inputs to be controlled via the TAP and device functional outputs to be monitored via the TAP. The INTEST mode allows the device functional logic circuits to be checked by applying test vectors and monitoring device response via the TAP. Modes not defined by the standard are known as private modes. An example of such a mode is a mode in which the TAP controls data shifting through an internal scan chain.

A register known as the instruction register is used to select the various operating modes of the TAP controlled test logic. Input bits destined for the TAP instruction register enter the device via the same interface line used for test data bits. The value of the data or instruction bits is determined by the current state of the TAP state machine. The length of the scan chain through the device (i.e., from the TDI line to the TDO line) is, therefore, determined by the length of the currently selected register.

The standard mandates the use of a number of registers. These registers, connected in parallel between a common serial input (TDI) and common serial output (TDO), include a bypass register, a boundary scan register and a number of optional test data registers. The length of the bypass register is defined as one bit. The instruction register has a minimum length of two bits and may be expanded as a user sees fit. For example, a 16-bit or longer instruction register may be appropriate for some applications.

During normal operation, all devices of a boundary scan chain are in the same TAP state machine state at any given time. Hence, it can be seen that the overall length of the boundary scan chain can vary widely depending upon the TAP selection of instruction versus data registers. While the length of the boundary scan chain may be minimized during the shifting of data bits by selecting the bypass register in some devices, it cannot be prevented from being expanded to the cumulative length of all device instruction registers during the shifting of instruction bits. Furthermore, since all instruction registers of the boundary scan chain must be updated together, an appropriate value must be determined for and shifted into all such instruction registers, not just the one or more instruction registers of immediate interest.

The inability to select particular devices of a boundary scan chain to receive instruction register updates, therefore, results in considerable overhead. To alter the contents of only one instruction register, the present state of all other instruction registers of the chain have to be determined and the appropriate bits made to proceed and follow the bits scanned into the instruction register of interest. For example, consider a boundary scan chain of a thousand serially connected devices, each having an instruction register 16 bits in length. To alter the 16-bit instruction register of one device, 16,000 bits would have to be shifted into the boundary scan chain once instruction register shifting was established. The shifting of 15,984 bits is viewed as overhead, since such shifting merely serves to restore the current contents of the other instruction registers not being altered. The overhead exists both in terms of time needed to shift in the bits and in the means needed in their determination.

It will be appreciated that the case where overhead would be somewhat minimized by specific instruction bit configurations and relative locations on the boundary scan chain has not been considered in the above example because of the greater importance of considering a general case.

Considerable overhead can also exist in the shifting of data bits. For example, again consider the case of a thousand devices in a single boundary scan chain. Assume, by virtue of previous instruction register entries, 999 devices have selected the bypass register and one device has selected an optional data register of 100 bits, for a total scan chain length of 1099 bits. Further, assume that it is desired to examine the contents of the optional data register each time new contents are shifted into the devices. In this case, up to 1099 shifts would be required for each change of the optional 100-bit data register, resulting in an overhead of 999 bits.

Since the standard mandates loading the bypass register with a logic zero at the same time the optional data register is loaded, as determined by the state machine, the shifted data cannot be retained in the bypass registers to alleviate the overhead condition.

Overhead in boundary scan operations is significant in that it decreases the number of tests that may be conducted within a reasonable amount of time and increases the amount of external hardware and associated software needed to apply those tests.

Despite the powerful capability of the architecture defined by the standard, implementation at the level of a large board or at the system level can present problems in terms of selecting boundary scan paths of manageable length during design.

Other problems also exist in determining boundary scan paths. One such problem is the case where electrical faults or shortcomings of the test interface, as with the clock line (TCK) cause erratic test operation. In this case, diagnosing and locating the fault within the test interface and its associated logic becomes more difficult as the length of the boundary scan chain increases.

Experts in the field have attempted to increase boundary scan chain manageability by creating multiple chains which are merged into a single interface grouping by means of added controller devices which have attributes similar to TAPs. One such device is the "Backplane Test Bus Link" described by D. Bhavsar in the published proceedings of the 1991 IEEE International Test Conference." Another such device is the "Addressable Shadow Port" described by L. Whetsel in the published proceedings of the 1992 IEEE International Test Conference.

These and similar such devices represent an overhead of a different kind. They have hardware overhead beyond that which is already contained in devices having TAP controllers that conform to the above mentioned standard. In certain cases, such devices and methods could be implemented as additions to devices already defined to be incorporated as part of a given design. However, whether or not such methods are implemented as dedicated devices or incorporated as part of an integrated circuit during design, they still represent an undesirable hardware overhead in the general case.

Accordingly, it is a primary object of the present invention to provide a method and means of minimizing the bit overhead of the boundary scan serial string test operations without incurring the overhead typically found in attempts to implement boundary scan in a multiplicity of strings at a board or system level.

It is a further object of the present invention to provide such method and means of minimizing bit overhead in a manner which does not conflict with present standards to the extent that devices incorporating the present invention could be used with devices previously manufactured to conform to the standard.

It is a still further object of the present invention to provide a method and apparatus for performing verification and diagnostic operations relating to the device test logic.

SUMMARY OF THE INVENTION

The above objects and advantages of the present invention are achieved in a preferred embodiment of a test access port (TAP) included in an IC device which provides electronic access to the circuits within the IC device. According to the present invention, the TAP incorporates additional logic circuits for establishing predetermined operating modes defined by a number of new boundary scan instructions. Each such instruction prevents affected IC devices from changing in either their current operating mode or scan path length between the TDI input and TDO output as a consequence of boundary scan chain instruction register or data register shifting operations. The modes remain effective until the TAP state machine enters a test logic reset state in a conventional manner which effectively disconnects the TAP from each IC device. That is, in the preferred embodiment, the mode is effective until such state is entered either through asserting an optional test reset (TRST*) line or by the repeated clocking of a test clock (TCK) line when in a test mode (i.e., a test mode select line at a logic one) wherein the number of times depends on the state machine condition at the outset.

The instructions of the present invention allow selection of either a single bit register or a direct connection to be placed in the path between a device's TDI input and TDO output. The single bit register in contrast to the above described bypass register, retains its current value at the point during data shifting that the bypass register is required to be set to zero. The single bit register of the preferred embodiment in contrast to the bypass register, remains active in the TDI to TDO path during instruction scan operations as well as data scan operations. The direct connection minimizes the overall boundary scan chain bit length and also reduces dependency on device clocking for shift operations.

The instructions further allow test logic present at device functional (i.e., non-test) pins to either retain or release control of those pins, making them useable during both test-only operations and background TAP operations running in conjunction with normal system functions.

The above objects and advantages of the present invention will be better understood from the following description when taken in conjunction with the accompanying drawings.

BRIEF DESCRIPTION OF THE DRAWINGS

FIG. 6 is a diagram illustrating a scan operation carried out by the preferred embodiment of the present invention and the prior art.

DESCRIPTION OF THE PREFERRED EMBODIMENT

Figure 1A:
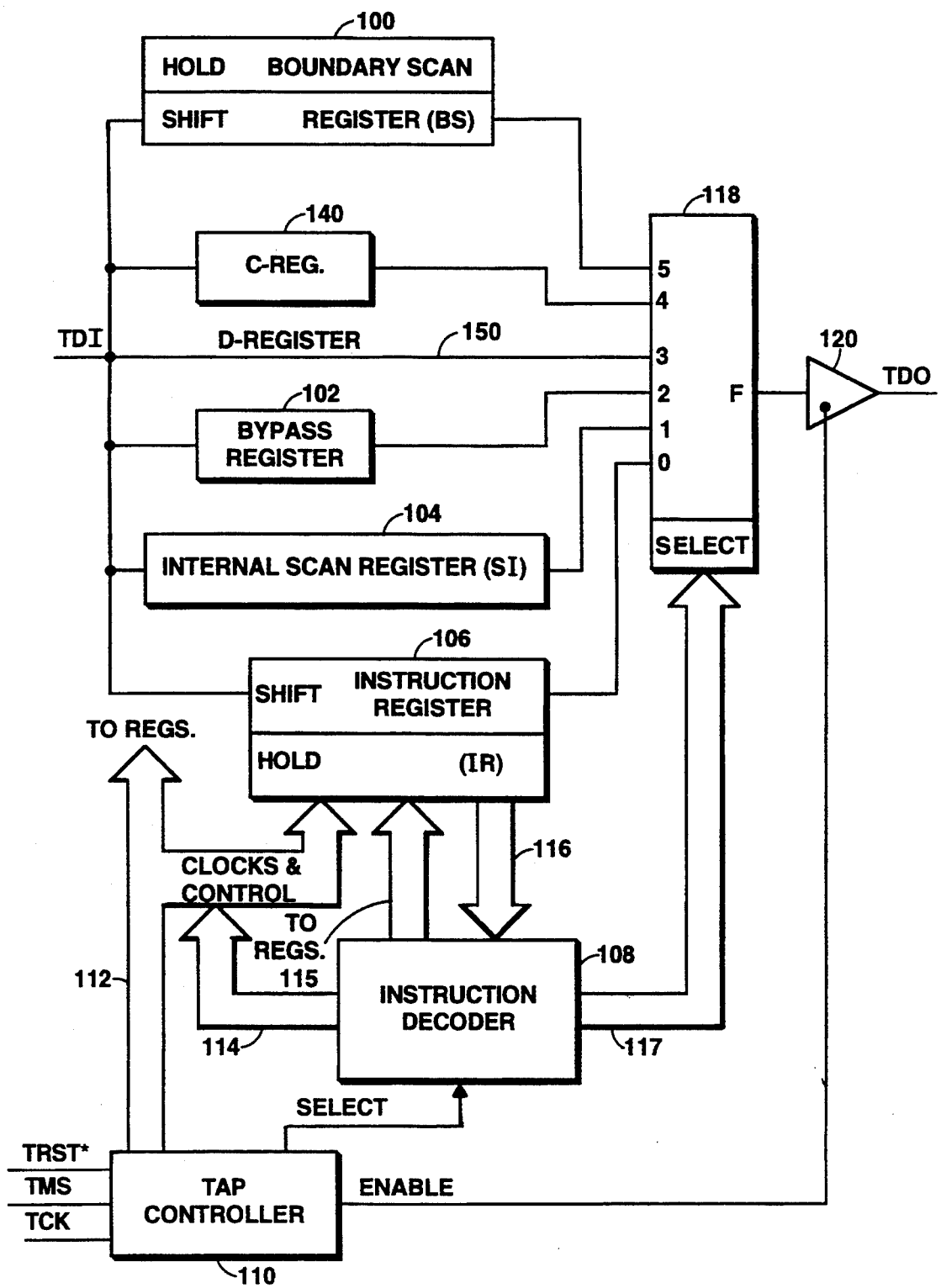
FIGS. 1a and 1b show the test logic circuits of a test access port which incorporates logic circuits of the present invention.

FIG. 1 shows a standard test access port (TAP) which incorporates the circuits of the present invention. As shown, the test access port includes a plurality of data registers 100, 102 and 104 and a multiplexer 118, arranged as shown. The data registers correspond to a boundary scan register 100, a bypass register 102 and internal scan register 104 which connect to multiplexer 118. The TAP further includes a typical instruction register 106, an instruction decoder 108 and a controller state machine 110. The value loaded into the instruction register 106 which is then decoded by decoder 108 determines the TDI (test data in) to TDO (test data out) path selection during data shift operations. That is, the multiplexer 118, the output of which drives TDO driver 120, is controlled via lines 117 from decoder 108 in accordance with the value defined by the previously loaded instruction in conjunction with signals from TAP controller 110.

The TAP controller 110 includes a state machine and clock circuits which generate the required-control and clocking signals applied to the different registers of FIG. 1a. Additionally, TAP controller 110 provides as outputs, select and enable signals which are applied as inputs to the instruction decoder 108 and an output driver circuit 120 respectively. The controller 110 receives as inputs, an optional test reset state (TRST*) line, a test mode select (TMS) line and a test clock (TCK) line. The TCK and TMS lines determine the currently active state of the controller state machine of each IC device. The TRST* line, if present, overrides both to force a reset.

The controller state machine is designed such that a logic ONE present on the TMS line for five consecutive clocks of line TCK always results in placing the state machine in a test logic reset state. In this state, the IC device test logic has no effect on the IC device functional logic circuits and device operates as if such test logic were not present. The TRST* line may be included in IC devices where there is a need to enter the test logic reset state immediately (i.e., without having to wait up to five TCK clock cycles).

The TAP controller 110 generates the select signal on a select line during state machine states defining when the instruction register 106 is the register selected by multiplexer 118 as the path between input TDI and output TDO. The select signal causes instruction decoder 108 to apply an appropriate select code value on line 117 designating instruction register 106 as the register to be selected. The TAP controller 110 generates the enable signal during machine states defining instruction register and data register shifting operations.

For further details regarding TAP controller 110, in addition to the TAP and boundary scan operations, reference may be made to the publication entitled, "IEEE Standard Test Access Port and Boundary-Scan Architecture," published by the Institute of Electrical and Electronics Engineers, Inc., Copyright 1990.

In the preferred embodiment, boundary scan register 100 includes a shift register section and hold/storage register section. This allows register shift and update operations to be performed independently. The instruction register 106 is similarly constructed. The boundary scan register 100 normally included as part of the IC device consists of cells logically positioned for monitoring IC inputs (i.e., signals originating from without the IC device) or pins for driving inputs to the functional logic of the IC device (i.e., to have the effect of signals originating from without the IC device) and for driving external lines which connect to outputs or bidirectional connections of the IC device. By serially scanning binary values into the boundary scan register 100 via input TDI, test vectors can be applied to an IC device to which the test system is unable to make contact, except via the TAP.

Bypass register 102 is a single bit shift register which is reset at the start of data shift operations. Generally, its purpose is to minimize the path between TDI input and TDO output. This register is selected by default each time the TAP is reset unless the device includes an optional identification register. In such case, the latter register is selected at TAP reset. The optional identification register (not shown) contains 32 bits, the one nearest to the TDO output being placed in a logic one state. Thus, the resetting of bypass register 102 allows a test system to examine the TDI to TDO path of numerous serially connected IC devices and distinguish between the two types of IC devices (i.e., those with and without identification registers).

The internal scan register (SI) 104 includes a plurality of storage cells/elements of the functional logic of its respective IC device that are interconnected to form a serial string internal to the device during test so as to facilitate testing. This type of arrangement is described in U.S. Pat. No. 3,582,902 to Allen C. Hirtle, et al.

In accordance with the present invention, two transfer registers have been incorporated into the TAP structure of FIG. 1a. These are a single bit register 140 and a zero length register 150 implemented by directly connecting the TDI input via a "zero length register" line 110 as an input to multiplexer 118. The direct connection, when selected by means of an appropriate instruction, provides logical continuity of the TDI to TDO path without necessitating clocking by the TAP. The single bit register 140 in contrast to the bypass register does not get reset at the beginning of each shift operation. The register 140 is referred to herein as the C register. The zero length register 150 is referred to herein as the D register. Referring to the direct connection as a zero length register is done only for ease of explanation in describing the present invention in light of the prior art.

Figure 1B:
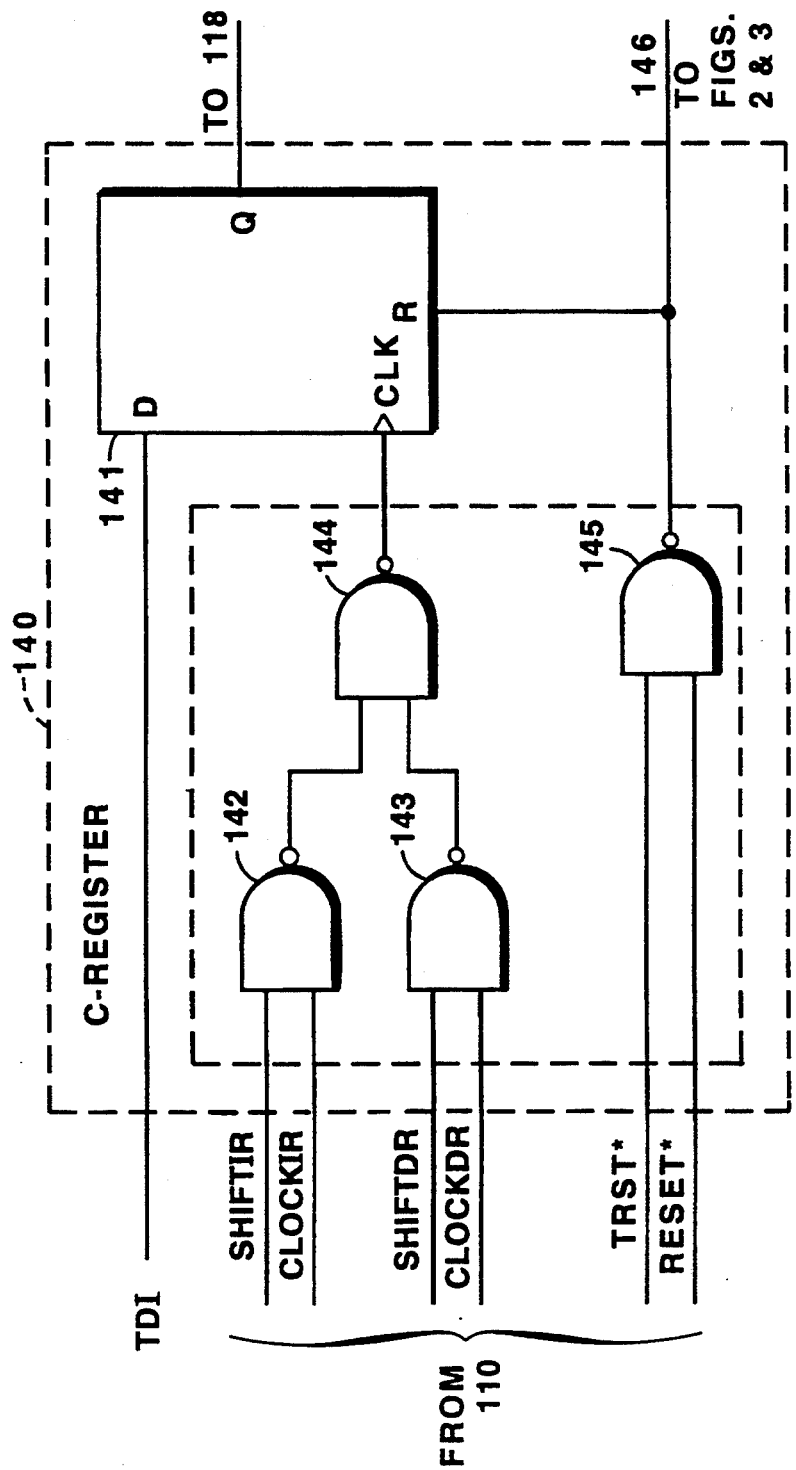

The C register 140 is shown in greater detail in FIG. 1b. As seen from FIG. 1b, C register 140 includes an input section and a storage section. The input section includes NAND gates 142 through 145 which receive the different clock and control signals SHIFTIR through RESET* from TAP controller 110. The storage section includes a clocked D-type flip-flop 141 whose D input terminal connects to the TDI line and whose Q output terminal connects to one of the data selection inputs (i.e., input 4) of multiplexer 118. The clock input terminal (CLK) and reset input terminal (R) connect to the outputs of NAND gates 144 and 145 respectively.

Figure 2:
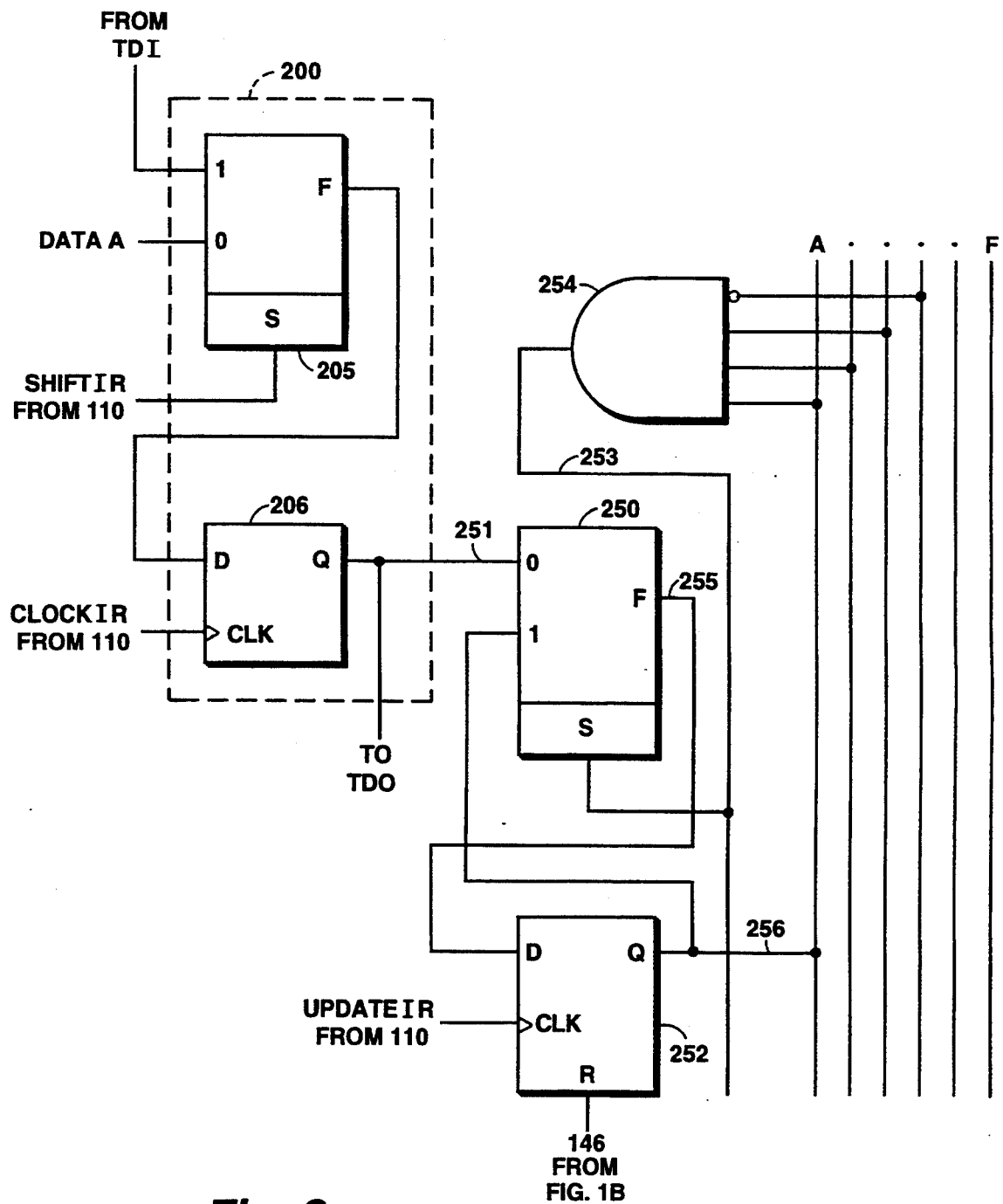
FIG. 2 shows a typical instruction register cell which incorporates logic circuits of the present invention.

FIG. 2 illustrates a typical instruction register cell which makes up the six-bit instruction register of FIG. 1 constructed according to the present invention. The shift register section 200 of the instruction register includes a conventional multiplexer 205 and a clocked D-type bit shift register stage 200 connected in series as shown. The instruction register hold section of the cell consists of a D-type clocked instruction bit register stage 252. The instruction register stage 252 and part of its directly associated circuitry has been modified to include a multiplexer 250 positioned between the instruction bit shift register cell 206 and instruction register bit cell 252. Normally, the D-input of stage 252 connects to the output of stage 206 via an extension of the Q output line which connects to TDO through further logic. According to the present invention, logic elements 250 and 254 have been included and means are provided to recirculate stage 252 via an extension of the Q line 256. The AND logic gate element 254 allows decoding of four instruction register bit signals, applied via lines A through D (hereinafter bits A through D).

The other bit storage elements of the instruction register of the present embodiment are not shown since they are not utilized by the preferred embodiment of the present invention. Thus, the logic elements 250 and 254 recirculate instruction register values for four instructions which are determined by bits A through D and not the other two bits. The recirculation of instruction values is an important part of the present invention.

As previously mentioned, FIG. 2 shows only stage one of the six-bit instruction register 106 of the present embodiment. As shown, logic element 254 is connected to receive signals corresponding to instruction register bits A through D for decoding four instructions. Each of the remaining cells contains identical logic circuits (i.e., basic instruction register cell) and also utilize the output of logic gate 254 and an element similar to multiplexer 250.

Figure 3:
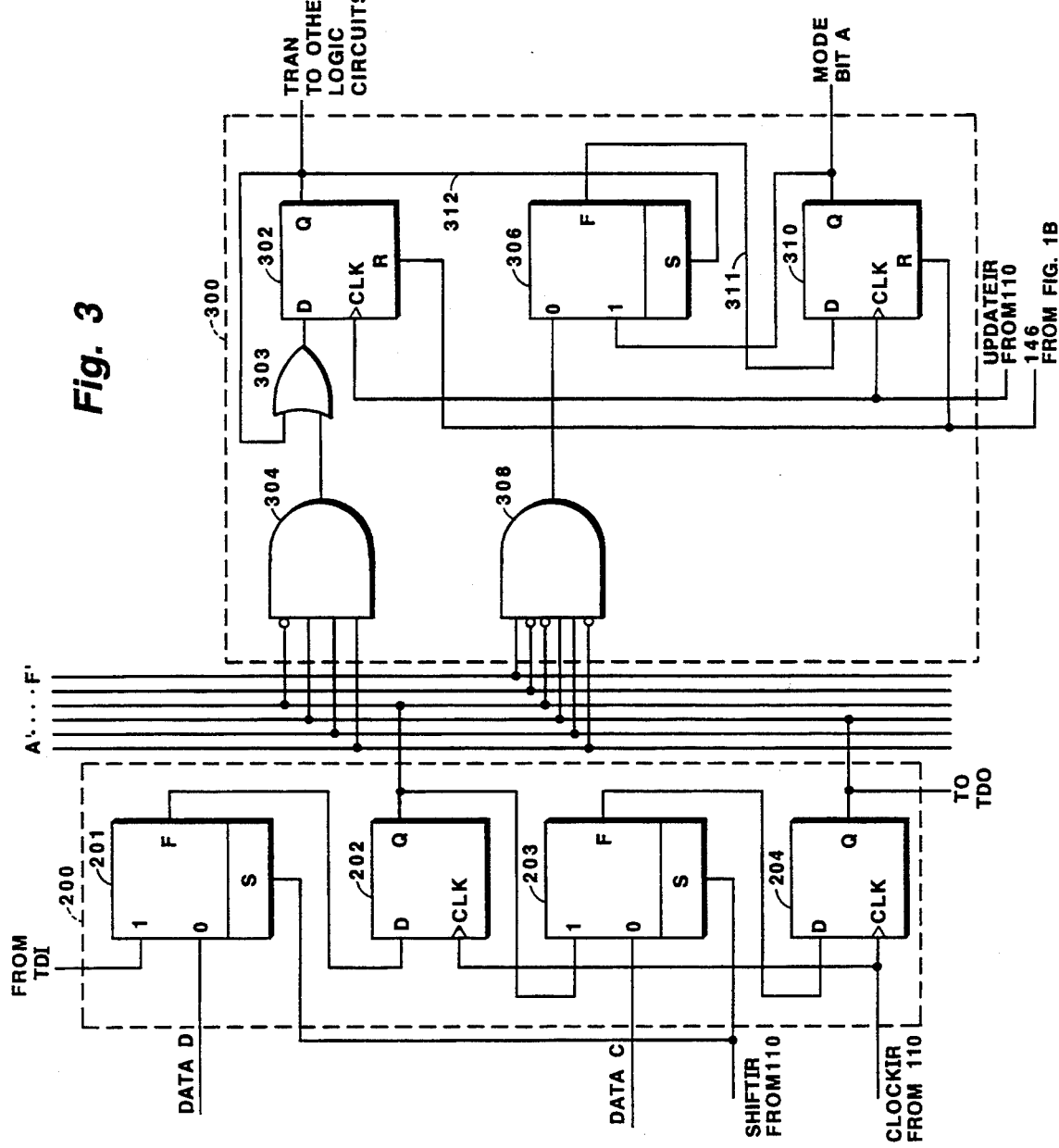
FIG. 3 shows a typical mode control cell which incorporates logic circuits of the present invention.

FIG. 3 shows an alternate embodiment of the present invention. This embodiment allows for direct control of various operating modes of the TAP test logic as opposed to decoding values contained in the instruction register 160. The outputs of this circuitry provides operating mode signals which can be used for controlling the selection of test versus functional logic, selecting the boundary scan register input, disabling of all output drivers, etc.

FIG. 3 shows two such cells, one which provides mode bit A representative of a standard function and a second cell which provides a transfer mode bit. As seen from FIG. 3, each register stage of shift register section 200 is identical to section 200 of FIG. 2. However, mode bit A corresponds to the output of cell stage 310. An AND logic gate element 308 provides the decoding necessary to set or reset cell 310 at the rising edge of the clock line UPDATEIR. If the transfer mode bit signal on line 312 is a logic zero, the decoded value of the instruction corresponding to shift bits A' through F' is transferred to the D-input of mode bit A cell stage 310 by a multiplexer 306. Alternatively, if the transfer mode bit signal is a logic one, multiplexer 306 causes recirculation of cell stage 310, retaining the stored value of mode bit A.

Each set of elements 201, 202 and 203, 204 perform a function similar to the function of elements 200 and 206 in FIG. 2 and are not part of a single instruction register shift string. That is, they pre-decode certain bits to effect operating modes versus having to decode the value subsequently loaded into the instruction register in the embodiment of FIG. 2.

DESCRIPTION OF OPERATION

With reference to FIGS. 1 through 6, the operation of the present invention will now be described. The apparatus of the preferred embodiment of the present invention incorporates four specific instructions. These are designated as CTRANS, CTRANT, DTRANS and DTRANT. The first letter of each designation represents the register of the present invention chosen in the TRANsfer path between the TDI input and the TDO output. The prefix letter C of the designation represents the clocked path of the single bit register while the prefix letter D represents the direct or zero length register. The last letter of each designation represents the overall operating mode of the system which connects to the test system wherein the letter S represents the system or functional mode in which the system is performing its normal use task (i.e., the test logic is essentially transparent) and the letter T represents the test mode in which various IC system functions are being interrupted for test purposes.

The CTRANS instruction is carried out by loading a predetermined value into the instruction register. Referring to FIG. 2, it is seen that the element 252, D flip-flop, corresponds to bit A of the instruction register. The other bits of the instruction register are B through F. The loading of any instruction depends on the current instruction not being one of the four TRAN instructions. In the present embodiment, a TRAN instruction is assumed to have the bit configuration 0111XX, where the first bit is bit A, second bit is B, etc., and the values of bits E and F are irrelevant (X). It should be noted that, in the absence of a TRAN instruction in the instruction register, AND gate 254 produces a logic zero output on line 253, resulting in establishing a transfer path between lines 251 and 255 through multiplexer 250. If the current instruction is a TRAN instruction, the transfer path caused by a logic one on line 253 is established between lines 255 and 256 which causes the current instruction to be reloaded/retained.

Under control of the TAP controller 110, the bit configuration for the CTRANS instruction is shifted into the six instruction shift cells, storage element 206 being one such cell. Data from the TDI input arrives at the D-input of storage element 206 by virtue of the path selected by the TAP controller SHIFTER line input to multiplexer 205. When all instruction bits for the six bits of the present instruction register, and all bits of all instruction registers of the various boundary scan devices on the serial string of which the present IC device is a part have been shifted in, the TAP controller within each such device causes the UPDATEIR line to change from a logic zero to one. The resulting rising edge at storage element 252 and its numerous counterparts on the present and other devices causes the binary value of element 206 to be transferred to element 252 through multiplexer 250 in the manner described previously.

Referring now to FIGS. 1a and 1b, the TDI to TDO path selected by the instruction register 106 and TAP controller state machine is established to be through storage element 141 by virtue of instruction decoder 108 which connects to multiplexer 118. Each TRAN instruction, upon being decoded by instruction decoder 108, disables the select input from TAP controller 110, preventing the logic which causes the instruction register path to supersede whatever other path is selected prior to the instruction scan series of state machine states.

The data arriving at input TDI is shifted through to the TDO output at each clocking of element 141. The clocking is produced by the TAP controller 110 which results in signals on the SHIFTIR and CLOCKIR lines applied to NAND gate element 142 and signals on the SHIFTDR and CLOCKDR lines applied to NAND gate element 143. It is important to note that, once a TRAN instruction becomes the current instruction of the TAP, the instruction bits and data bits are treated alike by the IC device insofar as their TDI to TDO path is concerned.

The CTRANS instruction further allows the system logic of the device to control the device system functional outputs. This is accomplished by virtue of mode bits as shown in FIG. 3. As discussed, mode bits differ from instruction bits in that they are predecoded. That is, unless bit configurations are chosen only to allow hardware simplicity, instruction register bits are required to be processed by a decoder (e.g. decoder 108)

to produce the various modal signals necessary to control device operation. In the case of mode bits, the decoded results are clocked into the mode register stages (e.g. elements 302 and 310 of FIG. 3) at the time instruction register bits would otherwise be clocked into the instruction register. It is possible for both types of register embodiments to exist either exclusively or simultaneously in a given system. The mode outputs activated by the CTRANS instruction can be used to activate mode selections logic, not shown.

The CTRANT instruction differs from the CTRANS instruction in that mode selection logic activates TAP control of the device system functional outputs. The IC device is, therefore, in a test mode. The mode selection logic activated by the CTRANT instruction is not shown.

It is important to note that certain boundary scan operations can be conducted without affecting system functional operation. Thus, the presence of a TRANT (CTRANT or DTRANT) instruction does not necessarily mean that system functionality has been interrupted.

The DTRANS instruction operates as does the CTRANS instruction except that zero register line 150 is selected as the input to multiplexer 118 by lines 117 on FIG. 1a.

The DTRANT instruction operates as does the CTRANT instruction except that zero register line 150 is selected as the input to multiplexer 118 by linen 117 on FIG. 1a.

Four instructions have been described: DTRANS, DTRANT, CTRANS and CTRANT, the distinctions being in the TDI to TDO path selected (C register versus D register) and overall K device operation (system functional versus test). It will be appreciated that other types of instructions may be provided. For example, the current operating mode of the device could be retained through use of the such instructions by additional instructions which could be designated as CTRANC and DTRANC, where the letter "C" indicates "current" mode. Also, the test mode which results from the execution of a CTRANT or DTRANT instruction could be used to specify retaining the current test mode or force other user predetermined test modes. Such additional instructions might be designated as CTRANT1, CTRANT2, where T1, T2 indicate test mode 1, test mode 2, etc.

The various modal possibilities can be readily determined by referring to the various standard logic implementation found in the above referenced publication entitled, "IEEE Standard Test Access Port and Boundary-Scan Architecture."

Referring to FIG. 2, the reset input of instruction register bit stage 252 is controlled by the output of logic NAND element 145 of FIG. 1b on line 146. Thus, whenever line TRST* or line RESET* is in a logic zero state, stage 252, and all other instruction register bit stages of the IC device are reset. The TRST* line reflects the state of the optional fifth TAP interface TRST* signal, which becomes a logic zero only when it is desired to reset the IC devices to the test logic reset TAP state by a tester. The TRST* line is not included in IC devices where the optional fifth line is not installed. The RESET* line becomes a logic zero when TMS line is held low through repeated clocking of line TCK. The TAP controller state machine has been designed such that this occurs within five TCK cycles. When either the TRST* line or RESET, line becomes a logic zero, then the instruction register 106 is reset. At that point, a TRAN instruction can no longer be the current instruction and instruction loading is no longer blocked. Thus, TRAN instructions operate to lock the IC device in a given TAP condition until the test interface controller (tester) causes the state of all TAP state machines in a given string (i.e., those having the same TMS and TCK or TRST* inputs) to assume a test logic reset state.

Figure 5:
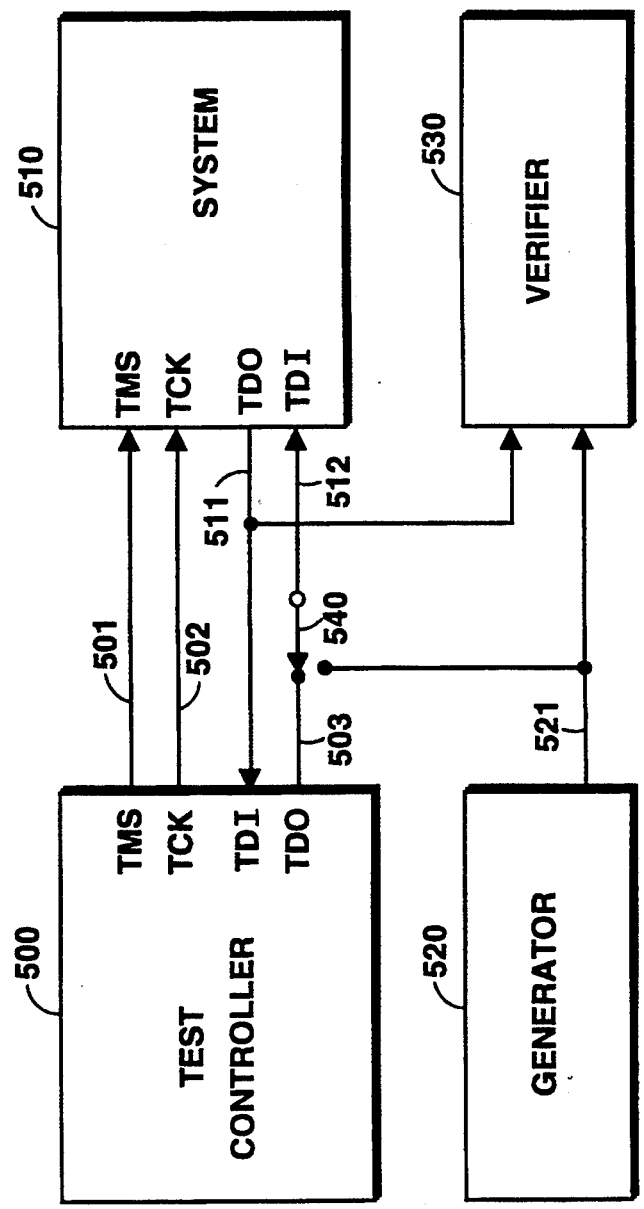
FIG. 5 shows an on-line monitoring configuration system of the present invention for continuously verifying test logic inactivity.

FIG. 5 shows how the present invention is able to verify the absence of impending test operations using the DTRANS instruction. This capability is intended for use in situations when unexpected control of device operation could be catastrophic. An example is an aileron control system of a jet fighter where the tester could accidentally force the execution of a maneuver exceeding the structural limitations of the aircraft. In some situations, it might be determined that sufficient safeguards are already built into a standard boundary scan system in that the test controller can be directed to hold TRST* at a logic zero and TMS at a logic one while clocking TCK indefinitely so as to produce the test logic reset state at all state machines. In other situations, such as those to which this operating mode is directed, the ability to provide independent verification that test operations are not impending at any point in the boundary scan chain is considered important.

Referring to FIG. 5, there is shown a test controller 500 which is a normal boundary scan test system. System 510, the functional unit, has been constructed of devices in which the DTRANS instruction can be executed. Generator 520 is an asynchronously operating oscillator. A verifier 530 compares the signal received on line 521 with that received on line 511. A switch 540 allows the generator signal on line 521 to be the input to the TDI input of system 530 in lieu of the TDO input on line 503.

Assuming successful system checkout by the test controller and normal functional operation of the system is about to commence, the test controller is directed to cause a DTRANS instruction to be executed in each device of the boundary scan chain, followed by holding line TMS at a logic zero when the state machine is in the run test idle state or by suspending TCK clocking. At this point, any input to the system TDI input is allowed to ripple through the scan path, now composed exclusively of a series of D registers, and appears at the TDO output after an appropriate delay. Since the DTRANS instruction can only be suspended when the test logic reset state occurs in a TAP device and since no device without an internal fault can be made to change instructions without first attaining the test logic reset state, the continued presence of essentially a direct path can be used as verification that no undesirable device activity is about to take place.

After executing the DTRANS instruction, switch 540 is then thrown to the position connecting lines 512 and 521. The verifier 530 now is able to compare the signals received on lines 521 and 511. After adjusting for the scan path delay, a decision can be made as to whether there has been an interruption of the scan path. Sensing such an interruption can be used to indicate an unplanned activity allowing backup equipment to be automatically invoked so as to prevent possible misoperation of system 510 from causing further problems.

Figure 4:
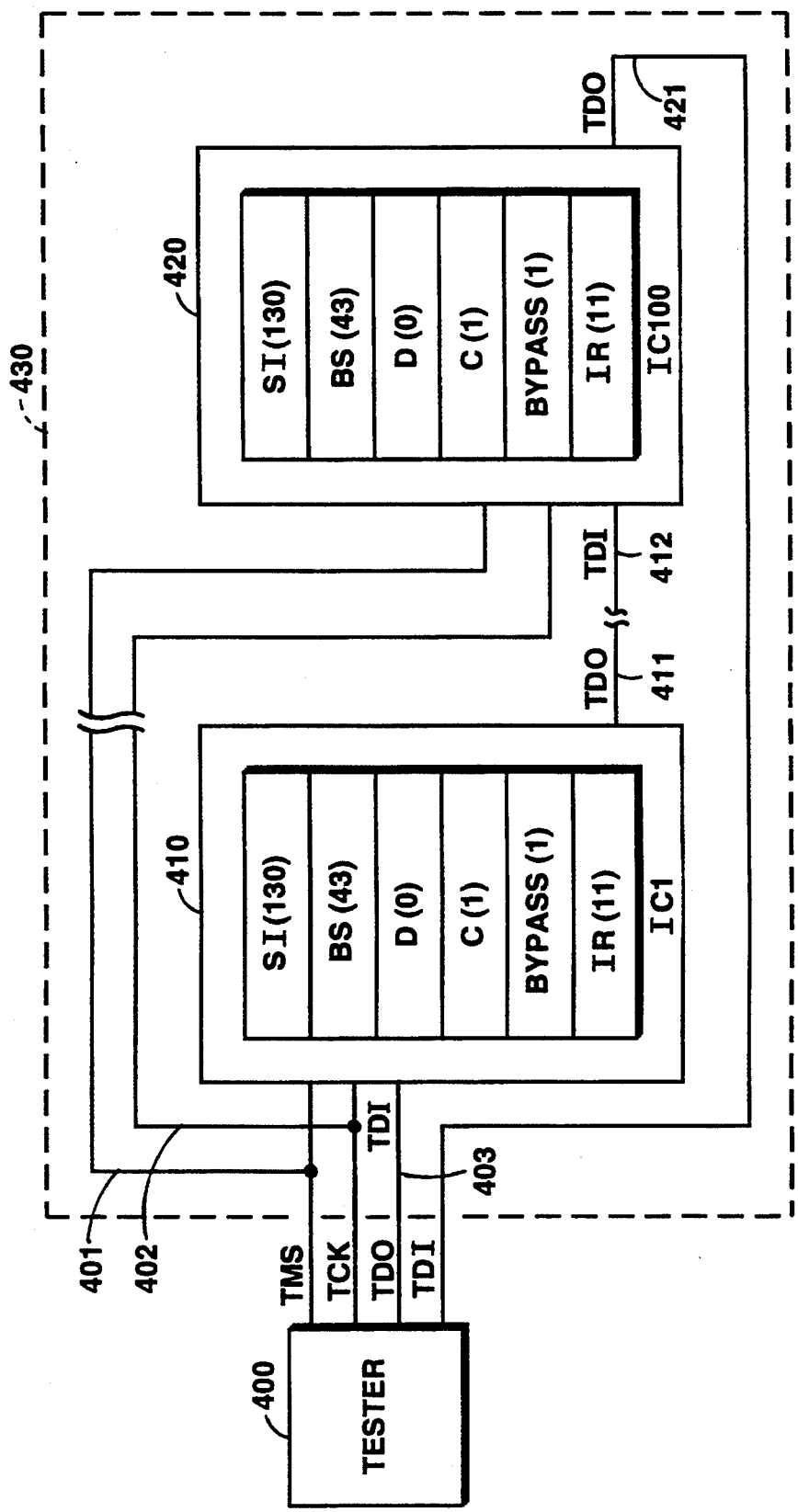
FIG. 4 shows an example system used in describing the operation of the present invention.

Referring to FIGS. 4 and 6, operation of the present invention will now be described in terms of savings of the number of bits needed to be passed through the serial chain in order to test a given device on the serial chain.

Tester 400 is connected to a printed wire board assembly 430 by means of the standard four-wire boundary scan interface which includes lines TMS, TCK, TDO and TDI. Board 430 is populated with 100 integrated circuits, IC1 through IC100 of which the first device 410 and last device 420 are shown. The tester 400 connects directly to the TMS and TCK input of each IC device via lines 401 and 402, respectively. For purposes of simplicity, the drive circuits which may normally be required have been omitted. The tester TDO line 403 connects to TDI input of the first device IC1 in the serial string, IC1. Similarly, line TDO 411 of IC1 connects to TDI input of the next IC device (not shown) in the serial string. The TDI input line 412 of the last IC device IC100 of the serial string is driven by the TDO output of the penultimate device (not shown). Line 421 completes the serial string by connecting the TDO output of the last device IC100 of the serial string back to the TDI input of the tester 400.

For illustrative purposes, all devices are assumed to have six test registers: an 11-bit instruction register, a 1-bit bypass register, a 1-bit C-register, a 0-bit D-register, a 43-bit boundary scan register (labeled BS) and a 130-bit internal scan register (labeled SI). For illustrative purposes, the lengths of the instruction, boundary scan and internal scan registers within the IC devices have been arbitrarily chosen at 11, 43 and 130 bits, respectively. In this example, except for having the same register lengths, the 100 ICs differ significantly in function from one another. That is, there is no relationship between the optional codes needed to be supplied to the various instruction registers, the bit positions versus device pin functions of the various boundary scan registers, the internal device functions of the various internal scan registers and the functional logic contained within the various IC devices. It will be presumed that a sufficient internal test of each IC device may be conducted by applying 1,000 test vectors to each device. That is, each IC device is tested by shifting in stimulus to each IC device from the tester 400, clocking the IC device, and shifting the results out to tester 400 for evaluation after each test vector.

In the preferred embodiment of the present invention, during Scan 1, all IC devices are issued an instruction to select the boundary scan register (BS) so as to establish it as the path between TDI and TDO in Scan 2. This requires the tester 400 to shift or scan 1,100 bits into the serial chain of the IC devices in addition to applying signals to lines TMS and TCK such that the TAP controller state machine in each IC device causes the appropriate shifting therein. During Scan 2, the boundary scan register of each IC device is then loaded. This, requires 43 bits for each device, or a total of 4300 bits. At this point, the various IC devices comprising board 430 can be in a state suitable for testing. That is, with proper selection of the values loaded into the various boundary scan registers, conflicts between the various devices that may otherwise take place during subsequent test operations may be eliminated. For example, if the relevant outputs of all IC devices driving a bus were set to a high impedance state, drive conflicts between IC devices on the bus would be minimized as a concern during testing.

The two scans described above are diagrammed in FIG. 6. In FIG. 6, the scan operations to perform a one thousand vector test of one IC device in a scan string of 100 IC devices is shown on the left for a group of IC devices with TAPs constructed according to the present invention and on the right for the prior art. The scan steps and their functions are noted in the center of FIG. 6. The number of bits scanned in each step is tabulated at the left for the present invention and at the right for the prior art. For illustration, IC40 has been chosen as the IC device to be tested by the test vectors. In either the case of the present invention or the prior art, the first two scan steps are the same, each requiring 1,100 bits and 4,300 bits, respectively, to be scanned. In Scan 1, an instruction register scan is performed on the entire string of 100 IC devices. The instruction for each IC device specifies the boundary scan register is to be scanned during the next data register scan. The "11 (BS)" in each block of FIG. 6 relating to Scan 1 indicates the length of the register being scanned and, for instruction register (IR) scans, the type of instruction. In Scan 2, a data register (DR) scan, the boundary scan (BS) registers are loaded, each with 43 bits for a total of 4,300 bits for the 100 IC devices of board 430.

In Scan 3, the first departure takes place between the present invention and prior art. Both are IR scans. In the case of the present invention, a DTRANT instruction is issued to each IC device other than IC40 (i.e., to the 99 others), which is issued an instruction selecting the boundary scan register. In the prior art, an instruction to select the bypass register would have been issued to each of the 99 other IC devices and to the boundary scan register of IC40. In FIG. 6, the selection of the D register is indicated in parenthesis as "D" and the bypass register as "BY". In both implementations, Scan 3 requires 1,100 bits to be scanned.

In Scan 4, a DR scan, the first example of the bit economy aspect of the present invention is illustrated. In Scan 4, the boundary scan register of IC40 is to be loaded with 43 bits. In the case of the present invention, the output state of the tester 400 is applied to TDO which is in turn directly transferred to the TDI input of IC40. That is, since the previous instruction (Scan 3) selected the zero-length D register as the path between TDI and TDO of each IC device other than IC40, the level present at the TDI input of IC40 will be the same as the level present at the TDI input of IC1. Again, because of the D register selection, the level present at the TDO output of IC100 will be the same as the level present at the TDO output of IC40. Aside from the TDI to TDO delay within each of the other ICs, the tester TDO output is essentially directly connected to the TDI input of IC40 and the TDO output of IC40 is essentially directly connected to the TDI input of the tester. Given this essentially direct connection, the 43 bits for the boundary scan register of IC40 are loaded by a 43-bit scan operation. Alternatively, in the prior art case, the single bit bypass (BY) register has been selected as the path between TDI and TDO for each IC other than IC40. Therefore, after the tester has scanned the 43 bits intended for IC40 into the TDI input of IC1, 39 more bits must be scanned in so that the first 43 bits will be transferred to IC40. At the end of the scan operation, 39 bits will be present in the bypass (BY) registers of devices IC1 through IC39. The bits present in bypass (BY) registers at the end of a scan operation have no effect on operation of the test logic. That is, standard boundary scan operations define the boundary scan register being set to zero at the beginning of each scan operation. The 39 extra bits needed to be scanned in the prior art case result in a total of 82 bits for Scan 3, versus 43 bits in the case of the present invention.

In Scan 5, an IR scan, the difference is more dramatic. The purpose of this scan is to select the 130-bit internal scan register of IC40, denoted by "(SI)" in FIG. 6, for subsequent data register (DR) scans. In the case of the present invention, by virtue of the essentially direct connection previously established with the tester, the scan will consist of 11 bits. In the prior art case, the scan string consists of the instruction registers of all 100 IC devices, since the TAP controller state machines of all such IC devices must be in the same state. Thus, the scan string in the prior art case will be 1,100 bits. Furthermore, since unspecified IC operation can result from allowing instruction registers to be loaded with residual values, it is generally considered good practice to load all instruction registers with known values. Therefore, the prior art case requires 1,100 bits to be scanned in Scan 5, versus 11 in the case of the present invention.

In Scan 6, a DR scan is used to load the 130-bit internal scan register of IC40 and 130 bits are scanned in the case of the present invention. In the prior art case, an extra 39 bits would be required as in the loading of the boundary scan register in Scan 4.

Scans 7 through 11 are repeated 999 times in order to achieve the one thousand vector test intended to be conducted on IC40 as discussed previously.

In Scan 7, an instruction is to be loaded which applies a clock cycle to the functional logic within IC40. That is, data for a single test vector was loaded in Scans 4 and 6. The results of the test will replace that data when a clock pulse is applied. The clock pulse will be generated internally within IC40 as a result of the appropriate instruction having been loaded into the instruction register. The practice and methods of constructing an IC device so as to operate for test purposes in this fashion are well known in the art. As in Scan 5, 11 bits will be scanned in Scan 7 in the case of the present invention as opposed to 1,100 bits in the prior art case. Since Scan 7 is repeated 999 times, the number of bits scanned in each case will therefore be 10,989 versus 1,098,900, respectively.

In Scan 8, another IR scan, the boundary scan register of IC40 will be selected for subsequent scanning. As in Scan 5, the bypass (BY) registers of the other IC devices will be selected in the prior art case. As explained in Scan 7, the number of bits scanned in the case of the present invention would be 10,989, versus 1,098,900 in the prior art case.

Scan 9, a DR scan, serves the dual purpose of scanning out the results of the previous test vector as described in Scan 7 and loading a new test vector to be applied later. In the case of the present invention, this is accomplished by scanning in 43 bits. In the prior art case, 103 bits will have to be scanned. That is, the IC40 boundary scan register bit closest to the TDI input of IC40 is the 103rd bit position from the TDO output of IC100 in the prior art case. Scanning the full 142 bits of the 43-bit boundary scan (BS) register of IC40 plus the 99 bits of the bypass (BY) registers of the other IC devices is avoided by beginning to scan new test vector data before the previous test vector results have fully emerged from the TDO output of IC100 (again, only applicable to the prior art case). In the 999 executions of Scan 9, 42,957 bits would be scanned in the case of the present invention versus 102,897 bits in the prior art case.

Scan 10, an IR scan, is the same as Scan 8, except that the internal scan (IS) register of IC40 will be selected on subsequent DR scans as opposed to the selection of boundary scan register. The number of bits scanned will be the same in both cases.

Scan 11, a DR scan, is similar to Scan 9, except that the 130-bit internal scan register is used instead of the 43-bit boundary scan register. In the case of the present invention, 130 bits would be scanned in each of the 999 executions of Scan 11 for a total of 129,870 bits. In the prior art case, 190 bits would have to be scanned each time, for a total of 189,810 bits.

Scan 12 is the same as Scan 7, but is executed only once. Similarly, Scan 13 is the same as Scan 8, but is executed only once. For each of these two scans, 11 bits would be scanned in the case of the present invention versus 1,100 bits in the prior art case.

Scan 14 is the same as Scan 9, but is executed only once. Furthermore, since no new test vector is to be loaded, the levels applied at the TDI input of device IC1 during the scan are irrelevant. Scanning 43 bits is required in the case of the present invention versus 103 in the prior art case.

Scan 15 is the same as Scan 10, but is executed only once. In the case of the present invention, 11 bits would be scanned, versus 1,100 for the prior art case.

Scan 16 is the same as Scan 11, but is executed only once. Furthermore, since no new test vector is to be loaded, the levels applied at TDI of IC1 during the scan are irrelevant. Scanning 130 bits is required in the case of the present invention versus 190 in the prior art case.

As shown in FIG. 6, the total number of bits needing to be scanned to test device IC40 in the manner described is 212,684 bits in the case of the present invention, versus 3,600,851 bits in the prior art case.

In certain situations, achieving bit economy using the C register in lieu of the D register may be preferred. As the number of devices in the scan path increases, so does the cumulative delay through the path. That is, a certain delay exists between a TDI input pin of a given device and its TDO output when the D register is selected as the TDI to TDO path. The cumulative delay affects the rate at which bits may be clocked through the scan path. That rate affects the overall test time. When the number of devices in the scan chain would diminish the test rate to an extent considered significant, by using D registers, C registers may alternatively be utilized.

Since C registers introduce no cumulative delay in the scan path, but operate as do the other registers of the TAP, clock rate is not diminished. Since C registers, unlike bypass registers, are not reset at each scan and are able to transfer both data and instruction bits, C registers in the scan path before and after the IC device of immediate interest effectively comprise a pipeline to and from that device. As is the case with other such pipelines, the difference in time between the loading of bits and their eventual effect (e.g. positioning within the pipeline) requires management overhead.

Selective use of D registers may also be used in diagnosing clocking problems affecting proper operation of the scan chain. Referring again to the example of IC40 in FIGS. 4 and 6, and assuming the TCK clock line observed at IC40 was affected by noise within the system, that fault might be diagnosed by attempting to perform the testing of each IC device in turn after issuing a DTRANT instruction to all other IC devices. In the case of certain faults, device IC40 would be the only device unable to consistently pass a sequence of test operations. In the case of the prior art, scan path misoperations would be more likely to render impracticable the diagnosis through TAP operations (i.e., without manual probing).

The functionality of the D register could be further extended to provide for interrupt signalling in addition to verification. For example, a multi-input gate could be added to the single wire D register path. One input of the gate could be connected to the TDI input, and the other input connected to be normally at a logic one level. The output of the gate would be connected like the D register connects to the multiplexer 118. Thus, when the system is used in a verification mode such as that depicted in FIG. 5, a change in the level of the normal logic one level at the gate input in any of the IC devices included in the serial scan chain would be apparent at the TDO output of the final device in the serial scan chain (i.e., at the verifier input). The change in level could be made to occur when a particular IC device detected a fault condition or any other significant event. Thus, an interrupt mechanism is provided wherein any event sensed by the circuitry within an IC device connected in the serial scan chain will be propagated through the serial scan chain to other circuitry (internal or external).

It will be appreciated by those skilled in the art that many changes may be made to the preferred embodiment of the present invention without departing from its teachings. For example, the invention is not limited to any specific boundary scan architecture or specific instruction coding.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A test access port (TAP) included in an integrated circuit (IC) device for testing circuits within said device, said TAP having a standard interface which consists of a number of lines including a test data output (TDO) and a test data input (TDI) for use in testing and a controller for generating control and clocking signals for carrying out said testing, said TAP further comprising a plurality of standard registers connected to said controller and a multiplexer having a number of inputs and an output connected to said TDO line of said IC device, each register having at least a serial input and a serial output, said serial input of each register being connected to said TDI of said standard interface and said serial output of each register being connected to a different one of said multiplexer inputs, said TAP further including:

an additional number of register like transfer circuits, each register like transfer circuit having an input and an output, said input of each of said number of register like transfer circuits being connected to said TDI line and said output of each transfer circuit being connected to a different predetermined one of said inputs of said multiplexer; and, an instruction register for storing information pertaining to any one of a number of instructions coded for generating signals defining a number of operational modes, said instruction register being coupled to said multiplexer and to said controller, said instruction register in response to a first one of said number of instructions being applied by said TDI line causing said multiplexer to select and during said testing, maintain selected as a path between said TDI and TDO lines of said IC device, a first one of said number of said register like transfer circuits to effectively provide a minimum length shift path for minimizing the number of bits required to be shifted through a string of IC devices for carrying out said testing.

2. The TAP of claim 1 wherein said first one of said number of said transfer circuits corresponds to a wire conductor for providing a zero length bit shift path for minimizing shifting of said number of bits including data and instruction bits through said string of IC devices.

3. The TAP of claim 1 wherein said controller generates a selection signal for selecting said instruction register and wherein said instruction register includes means conditioned by said first one of said instructions for preventing said selection signal from changing path selection for maintaining selection of said first one of said number of said register like transfer circuits.

4. The TAP of claim 1 wherein a second one of said transfer circuits corresponds to a single bit register stage, said single bit register stage being connected to be clocked by signals from said controller, said single bit register stage in response to a second one of said number of instructions being applied by said TDI line causing said multiplexer to select and to maintain as selected as a path, said single bit register stage to provide a single bit length shift path for transferring bits clocked at a rate defined by said signals thereby minimizing shifting of data and instruction bits through said string of IC devices.

5. The TAP of claim 1 wherein said instruction register includes decode circuits for decoding said number of instructions, said decode circuits in response to each of said number of instructions, generating signals for selecting one of said number of register like transfer circuits, for defining said number of modes of operation and for maintaining selection of said one of said number of register like transfer circuits notwithstanding receipt of a select signal from said controller specifying a change in register selection.

6. The TAP of claim 1 wherein said instruction register includes predecode circuits for predecoding said number of instructions, said predecode circuits in response to each of said number of instructions, generating signals which are loaded into said register for selecting one of said number of transfer circuits, for defining said number of modes of operation and for maintaining selection of said one of said number of register like transfer circuits notwithstanding receipt of a select signal from said controller specifying a change in register selection.

7. The TAP of claim 5 wherein said instruction register includes reset circuit means connected to said controller, said controller in response to a test mode reset signal causing said instruction register to be reset to a predetermined value.

8. The TAP of claim 5 wherein one of said number of instructions is a CTRANS instruction coded to specify selection of a predetermined one of said number of register like transfer circuits for providing a clocked single bit length shift path between said TDI and TDO lines of said IC device and for generating mode signals for causing said IC device to operate in a system mode of operation wherein said device operates as if said TAP were not incorporated into said device.

9. The TAP of claim 5 wherein one of said number of instructions is a CTRANT instruction coded to specify said selection of said predetermined one of said number of register like transfer circuits for providing said clocked single bit shift path between said TDI and TDO lines of said IC device and for generating mode signals for causing said IC device to operate in a test mode of operation wherein said device performs said testing.

10. The TAP of claim 5 wherein one of said number of instructions is a DTRANS instruction coded to specify selection of a predetermined one of said number of register like transfer circuits for providing a zero length shift path between said TDI and TDO lines of said IC device and for generating mode signals for causing said IC device to operate in a system mode of operation wherein said device operates as if said TAP were not incorporated into said device.

11. The TAP of claim 5 wherein one of said number of instructions is a DTRANT instruction coded to specify said selection of said predetermined one of said number of register like transfer circuits for providing said zero length bit shift path between said TDI and TDO lines of said IC device and for generating mode signals for causing said IC device to operate in a number of test modes of operation wherein said device performs said testing.

12. The TAP of claim 5 wherein one of said number of instructions is a DTRANC instruction coded to specify selection of a predetermined one of said number of register like transfer circuits for providing a zero length shift path between said TDI and TDO lines of said IC device and for generating mode signals for causing said IC device to operate in a current mode of operation corresponding to either a system mode or test mode of operation.

13. The TAP of claim 5 wherein one of said number of instructions is a CTRANC instruction coded to specify said selection of said predetermined one of said number of register like transfer circuits for providing said clocked single bit shift path between said TDI and TDO lines of said IC device and for generating mode signals for causing said IC device to operate in a current mode of operation corresponding to either a system mode or test mode of operation.

14. A method of providing a number of additional modes of operation in a standard test access port (TAP) for minimizing shifting of instruction and data bits through a number of series connected integrated circuit (IC) devices, said standard TAP being included in each integrated device for testing circuits within said device, said TAP having a standard interface which consists of a number of lines including a test data output (TDO) line and a test data input (TDI) line for use in testing and a controller for generating control and clocking signals for carrying out said testing, said TAP further comprising a plurality of standard registers connected to said controller and a multiplexer having a number of inputs and an output connected to said TDO line of said IC device, each register having at least a serial input and a serial output, said serial input of each standard register being connected to said TDI line of said standard interface and said serial output of each register being connected to a different one of said multiplexer inputs, said method comprising the steps of:

a. incorporating an additional number of register like transfer circuits into each IC device, each register like transfer circuit having an input and an output;

b. connecting said input of each register like transfer circuit to said TDI line and connecting said output of each register like transfer circuit to a different predetermined input of said multiplexer;

c. including an instruction register for storing information pertaining to any one of a number of instructions coded for generating signals defining said number of additional modes;

d. connecting said instruction register to said TDI line, to said multiplexer and to said controller;

e. selecting in response to a first one of said number of instructions being loaded into said register through said TDI line, one of said additional number of register like transfer circuits designated by said instruction as a path between said TDI and TDO lines of said IC device; and, f. maintaining the selection of said one register like transfer circuits during testing so as to provide a minimum length shift path for minimizing said shifting of said data and instruction bits.

15. The method of claim 14 wherein said method further includes the step of:

g. resetting said instruction register to a predetermined value by said controller when a test mode reset signal is applied to said controller.

16. The method of claim 14 wherein step e further includes selecting one of said additional number of register like transfer circuits which provides a zero length shift path between said TDI and TDO lines of said device.

17. The method of claim 16 wherein said method further includes the steps of:

h. connecting a tester to each of said number of series connected IC devices;

i. loading said first one of said instructions coded to specify said zero length shift path into said instruction register of each IC device;

j. connecting a generator to said TDI line of a first one of said series connected IC devices;

k. connecting a verification circuit to said TDO line of a last one of said series connected IC devices; and, l. verifying that signals applied by said generator to said TDI line are propagated through said series connected IC devices within a predetermined minimum time period for indicating that there has been no change in state of said TAP of any one of said IC devices.

18. The method of claim 14 wherein said method further includes the steps of:

h. connecting a tester to each of said number of series connected IC devices;

i. loading into said instruction registers of a number of said IC devices except IC devices to be tested, said first one of said instructions coded to specify said zero length shift path;

j. performing a series of boundary scan tests by said tester on said IC devices to be tested; and, k. evaluating results obtained in step j to determine if any of said number of IC devices which were loaded with said first one of said instructions had responded incorrectly to signals associated with a previous series of boundary scan tests.

19. The method of claim 14 wherein step e further includes selecting one of said register like transfer circuits which includes a logic gate having a first input connected to said TDI line, a second input connected to a reference logic signal and an output connected to a predetermined input of said multiplexer for providing a shift path between said TDI and TDO lines of said device and said method further includes the step of changing the state of said reference logic signal for indicating the occurrence of a predetermined event within an IC device.

20. The method of claim 19 wherein said method further includes the steps of:

h. connecting a tester to each of said number of series connected IC devices;

i. loading said first one of said instructions coded to specify said logic gate length shift path into said instruction register of each IC device;

j. connecting a generator to said TDI line of a first one of said series connected IC devices;

k. connecting a verification circuit to said TDO line of a last one of said series connected IC devices; and, l. verifying that signals applied by said generator to said TDI line are propagated through said series connected IC devices within a predetermined minimum time period for indicating that there has been no change in state of said TAP and in said reference logic signal of any one of said IC devices.

* * * * *